Dec. 3, 1968 W. VAN BRAMER 3,414,433
ENCAPSULATION OF SEMICONDUCTOR
Filed July 7, 1965

WITNESSES
Theodore F. Wrobel
Donald M. Winegar

INVENTOR
William Van Bramer
BY
C. L. Menzemer
ATTORNEY

United States Patent Office 3,414,433

Patented Dec. 3, 1968

3,414,433

ENCAPSULATION OF SEMICONDUCTOR

William Van Bramer, Greensburg, Pa., assignor to Westinghouse Electric Corporation, Pittsburgh, Pa., a corporation of Pennsylvania Filed July 7, 1965, Ser. No. 470,109
8 Claims. (Cl. 117—200)

ABSTRACT OF THE DISCLOSURE

The exposed portion of a P-N junction of a semiconductor element is protected by a vapor deposited elastomeric silicone resin. The elastomeric silicone resin is introduced into an enclosure in which the semiconductor element is disposed. The elastomeric silicone resin is then vaporized and deposited on at least the exposed portion of the P-N junction of the semiconductor element.

Figure 1:
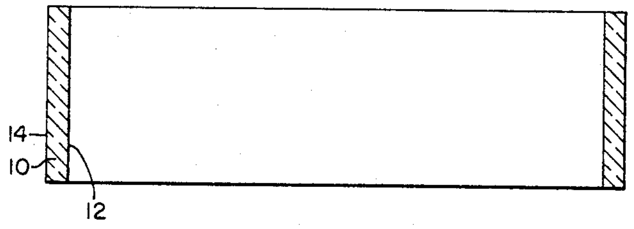

The present invention relates to a protective treatment for semiconductor devices and has particular reference to protecting semiconductor p-n junctions within silicon devices from the reactive components of the atmosphere.

In the operation of semiconductor devices degradation of performance frequently occurs due to surface phenomena such as the presence of leakage paths on or near the surface of the body of semiconductor material contained within the device. Various explanations of these phenomena have been proposed.

Most explanations of leakage phenomena involve either singly or in various combinations, the presence of adsorbed water molecules, fixed or mobile foreign ions, and a film of an oxide of the semiconductor material. Electrolytic conduction of ions or electrolysis of water molecules either at the surface of the semiconductor through a hydrous oxide layer of the semiconductor material, or at the outer surface of the semiconductor material's oxide layer has been proposed as an explanation for certain types of surface leakage. It has also been proposed that trapping states, both at the semiconductor surface and in the oxide layer, play an important part in surface condition and noise phenomena. The characteristics of certain charged layers on the surface, referred to as channels or inversion layers, have been extensively studied and it has been established that they can effect the electrical characteristics of P-N junction devices. One theory has proposed that an N-type surface layer can be established on germanium as, for example, on the P-type layer of an N-P-N transistor, by the adsorption of hydrogen ions made available by the reaction between germanium and moisture uopn its surface. Furthermore, it has been proposed that providing oxygen ions, which will react with the hydrogen ions and also replace them on the surface, will convert the surface from an unstable N-type to a stable P-type.

In order to prevent the deleterious effects of moisture and the reactive constituents of the atmosphere, semiconductor devices have been provided with a protective coating of suitable material. Suitable materials employed in prior art devices have included electrically insulating varnishes, shellacs, plastics and epoxies. These materials when properly applied to the semiconductor devices stabilize the electrical characteristics of the exposed surfaces of the devices within a tolerable range of values. By stabilizing these electrical characteristics, one is able to minimize the current leakage in a reverse direction across that portion of the surface in which a P-N junction is terminated.

The usual manner of providing a protective coating is to employ a hypodermic syringe, a fine brush, a wire loop and similar tools to apply the protective material on the semiconductor devices. These methods are time consuming and the semiconductor device may still be lacking a continuous protective coating on all the areas of the semiconductor devices which need protection.

An object of this invention is to provide an improved process for forming a uniform, continuous protective coating of suitable material on surfaces of a semiconductor device by vapor deposition from a source positioned within a hermetic container which encloses the semiconductor device.

Another object of the invention is to improve the device quality and the reliability of devices employing a body of semiconductor material having at least one P-N junction contained therein, a portion of which is exposed on a surface of the body.

It is another object of this invention to reduce the labor, time and process steps required to form a uniform continuous protective coating on at least those portions of surfaces of a body of semiconductor material having a P-N junction exposed therein.

Other objects of this invention will in part, be obvious and will, in part, appear hereinafter.

Figure 2:
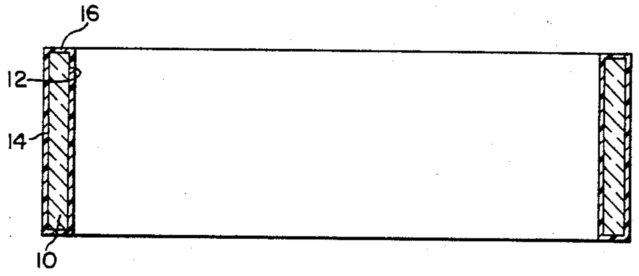
Figure 3:
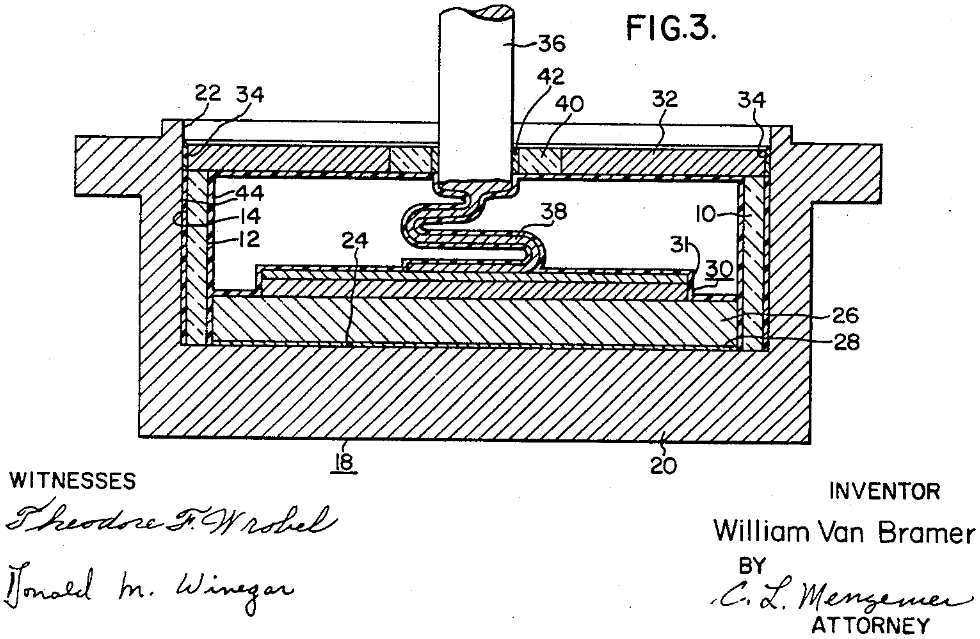

For a better understanding of the nature and objects of this invention, reference should be had to the following detailed description and drawings, in which:

FIGS. 1 and 2 are elevation views, partly in cross-section of a component of an electrical device being processed in accordance with the teachings of this invention; and FIG. 3 is an elevation view, partly in cross section of a semiconductor device made in accordance with the teachings of this invention.

In accordance with the present invention and attainment of the foregoing objects there is provided a semiconductor device comprising a body of semiconductor material sealed within a hermetic enclosure, the body of semiconductor material having at least one P-N junction contained therein. A protective coating of a suitable electrically insulating material disposed on at least that portion of the surfaces of the body of semiconductor material containing the exposed portions of the P-N junction, the protective coating having been vapor deposited from a source within the hermetic enclosure.

To more particularly explain the invention, reference will be made to a protective coating applied to body of silicon in a diode. However, it is to be understood that providing other electrical devices with a protective coating of one or more other suitable electrically insulating materials may be practiced in accordance with the teachings of this invention.

With reference to FIG. 1, there is shown a spacer 10 suitable for use in a diode, the spacer 10 is of a suitable electrically insulating ceramic material. The spacer 10 has an inside surface 12 and an outside surface 14.

Referring to FIG. 2, there is shown the spacer 10 which has a coating 16 of a suitable insulating material remaining on its surface after being treated in accordance with the teachings of this invention.

In selecting a suitable electrically insulating coating material certain properties should be considered. The material should adhere well to the surface of a body of semiconductor material, particularly that portion of any surface of the body having a P-N junction terminating therein. The material should also adhere well to other surfaces within the same enclosed area as the body of semiconductor material. The material should also have a high electrical resistance as well as being stable for long periods of time at the operating temperature of the device in which it is used.

The coating material should preferably be impervious to any form of moisture. It is desirable that the coating material either displaces the water inherently on the exposed surfaces of a body of semiconductor material or inhibits the ability of the water present from affecting the electrical characteristics of the body.

The coating material is preferably a material which will vaporize readily and redeposit as a uniform coating, or film, on a surface upon cooling to the initial ambient temperature. Care is taken to select a suitable material whose vaporization temperature will not have a deleterious affect on the body of semiconductor material. The material may be introduced into the system by any suitable means such, for example, as by placement of a solid within the electrical device, or the spraying, dipping or painting of a suitable component other than the body of semiconductor material. Care is taken to prevent the covering of any areas which are to be soldered since sufficient wetting of the areas by solder materials may be inhibited or prevented entirely.

Highly satisfactory results have been obtained from a mixture of an elastomeric silicone resin, such, for example, as a methyl-phenyl-silicone varnish, and a volatile solvent. A suitable mixture is commercially obtainable under the trade name Dow-Corning 997.

In coating the spacer 10, dipping as many as 25 spacers or more may be accomplished at one time by placing them in a perforated container and dipping them in a material mixture of a elastomeric silicon resin and a volatile vehicle. The batch of insulators 10 is then centrifuged to remove excess material mixture and to leave a thin film of the material mixture on each insulator 10. The film is thin enough to prevent insulators from adhering to each other but thick enough to provide enough elastomeric silicon resin to adequately coat the required surfaces of the finished product upon subsequent redeposition from a vapor state.

The coated insulator 10 is then heated to a temperature sufficient to partially fire the silicone resin and to partially convert the resin to a tough elastomeric. The curing time and temperature is not critical but should be sufficient to cure the resin enough to allow for handling the coated insulator 10 in automatic assembly machines without damaging the coating 16 or having coated insulators adhere to each other. Suitable catalysts known to those skilled in the art may be utilized to accelerate the curing of the resin. Such a catalyst is, for example, cobalt naphthenate.

It has been found that the coating 16 of the spacer 10 can be cured properly by placing each coated spacer 10 in a shallow pan and passing it through a furnace on a moving belt. The coated spacer 10 is heated at 375° C.±20° C. for 15 minutes. The temperature is then lowered to 275° C.±20° C. and the spacer 10 with its resin coating, remains at this temperature for 10 minutes. The spacer 10 is then cooled to 100° C.±10° C. before removing it from the furnace and then allowed to cool to room temperature.

With reference to FIG. 3, there is shown the spacer 10 after it has been assembled into a diode 18 and the coating 16 shown in FIG. 2 has been vaporized and redeposited.

The diode 18 comprises a good electrically and thermally conductive cup-shaped shell 20 made of a material such, for example, as copper. The shell 20 has an inner peripheral side surface 22 and an inner bottom surface 24.

The spacer 10 is disposed within the cup-shaped shell 18 and rests on the inner bottom surface 24. An electrical contact 26 is disposed within the spacer 10 and is affixed to the inner bottom surface 24 by a layer of suitable solder material 28. A body of semiconductor material 30 is disposed on the electrical contact 26 and has a P-N junction 31 contained therein.

An apertured washer member 32 is disposed on the upper portion of the spacer 10. The member 32 is affixed to the inner peripheral surface 22 of the shell 20 by a layer 34 of suitable solder material. An electrical lead 36 having a resilient contact portion 38 is disposed on, and is in electrical contact with, the body of semiconductor material 30 and passes through the aperture of the member 32. An insulating member 40 electrically insulates the lead 36 from the member 32. A layer 42 of suitable solder material is disposed between the insulating member 40 and the lead 36.

A hermetic package is formed by the shell 20, the apertured washer member 32, the insulating member 40 and the solder layers 34 and 42. All solder layers are simultaneously formed during one furnace operation.

During the soldering operation, the silicone resin is vaporized. Upon cooling to form the solder layer 28, 34 and 42, a layer 44 of silicone resin is deposited on all exposed surfaces within the hermetic package and particularly on the exposed surfaces of the P-N junction 31. The layer 44 of deposited silicone resin protects and stabilizes the junction 31 of the body of semiconductor material 30.

Although the vapor deposition of the layer 44 may be done as a separate operation, it can be satisfactorily accomplished during normal soldering operations required in making the diode 18.

In joining together the components of the diode 18, the furnace temperature varies from 450° C. to 500° C. and the furnace time from 10 to 12 minutes depending on requirements of the product. At 450° C., the temperature is still sufficient to vaporize the silicone resin.

Additional incidental benefits are achieved by coating the spacer 10 in this electrical device. One of the benefits is the preventing of any contaminants, which may be present within the structure of the spacer 10, from entering the confined environment of the body 30 of semiconductor material. These contaminants may effect the electrical characteristics of the body 30 and may even cause a complete electrical failure to occur.

Another incidental benefit is the reducing of potential damage to the body 30 during normal manufacturing processing. During assembly the body 30 is free to move about the confines of the electrical device in which it is disposed. The coating 16 reduces the possibility of any sharp projecting portions of the spacer 10 from scratching the body 30.

Still another incidental benefit achieved is the reduction in the amount of protective coating material required. Hand applications place large quantities of the material in a specified area and the thickness of the layer is much greater than really is required. However, present equipment can not reduce the quantity. The reaction times of individual workers vary from one to another and adequate coverage has to be assured. Subsequent soldering operations inherently only vaporize and redeposit the surface portion of the coating material within the device assembly while the majority of the mass of material is cured in place. Therefore the incidental benefit of the reduction of manual labor is inherently accomplished with the reduction of material required.

The process has been described with reference to one particular product only. It is appreciated, however, that other vapor coatings of electrical insulating material are obtainable in a similar manner. The vaporized layer may also require a separate pyrolyzing operation rather than be accomplished with the simultaneous soldering or brazing together of components of a device.

One appreciates of course that other methods of initially introducing a suitable coating material into the electrical device may be more practical for a particular application. The material as a liquid may be introduced into the device through either a mechanical or a manual metering means. Should a volatile vehicle be employed which may have possible contaminants resulting upon vaporization, ample precautions should be included to expel the volatile vehicle prior to vaporization of the protective coating material. A suitable material in a solid form may be mechanically or manually disposed within the device during assembly operations. Subsequent heating would vaporize the material and redeposit it as a thin continuous film upon cooling.

Since certain changes in carrying out the above processes for making a product embodying the teachings of this invention may be made without departing from its scope, it is understood that the accompanying description and drawings be interpreted as illustrative and not limiting.

I claim as my invention:

1. In a process for fabricating an electrical device including a body of semiconductor material, said body having at least one P-N junction contained therein, a portion of said P-N junction being exposed in a portion of a surface of said body, the steps comprising (1) disposing an elastomeric silicone resin on a component of said electrical device other than said body of semiconductor material, (2) enclosing said components having said elastomeric silicone resin disposed thereon and said body within an enclosed portion of said electrical device (3) heating said enclosed portion at an elevated temperature for a sufficient time to vaporize said elastomeric silicone resin and (4) cooling said enclosed portion whereby said elastomeric silicone resin is deposited as a protective coating on at least said exposed portions of said P-N junction.

2. The process of claim 1 including (5) hermetically sealing said enclosed portion, said hermetical sealing being performed during the same process steps of vaporizing and cooling said elastomeric silicone resin to deposit said elastomeric silicone resin as a protective coating on at least said exposed portion of said P-N junction.

3. In a process for fabricating an electrical device including a body of semiconductor material, said body having at least one P-N junction contained therein, a portion of said P-N junction being exposed in a portion of a surface of said body, the steps comprising (1) disposing a methyl-phenyl-silicone varnish on a component of said electrical device other than said body of semiconductor material, (2) enclosing said component having said methyl-phenyl-silicone varnish disposed thereon and said body within an enclosed portion of said electrical device, (3) heating said enclosed portion at an elevated temperature for a sufficient time to vaporize said methyl-phenyl-silicone varnish and (4) cooling said enclosed portion whereby said methyl-phenyl-silicone varnish is deposited as a protective coating on at least said exposed portions of said P-N junction.

4. A process for coating at least those portions of a surface of a body of semiconductor material in an electrical device in which a portion of a P-N junction is contained therein, the steps comprising (1) disposing a mixture of an elastomeric silicone resin and a volatile vehicle upon a component of said electrical device, said component being one other than said body of semiconductor material, (2) removing said volatile vehicle from said mixture disposed on said component, (3) enclosing said component and said body within an enclosed portion of said electrical device, (4) heating said enclosed portion at a sufficient temperature for a sufficient time to vaporize said elastomeric silicone resin and (5) cooling said enclosed portion whereby said elastomeric silicone resin is deposited on at least that portion of a surface of said body in which a portion of a P-N junction is situated.

5. A process for coating at least those portions of a surface of a body of semiconductor material in an electrical device in which a portion of a P-N junction is contained therein, the steps comprising (1) disposing a mixture of a methyl-phenyl-silicone varnish and a volatile vehicle upon a component of said electrical device, said component being one other than said body of semiconductor material, (2) removing said volatile vehicle from said mixture disposed on said component, (3) enclosing said component and said body within an enclosed portion of said electrical device, (4) heating said enclosed portion at a sufficient temperature for a sufficient time to vaporize said methyl-phenyl-silicone varnish and (5) cooling said enclosed portion whereby said methyl-phenyl-silicone varnish is deposited on at least that portion of a surface of said body in which a portion of a P-N junction is situated.

6. A process for coating at least those portions of a surface of a body of semiconductor material in an electrical device in which a portion of a P-N junction is contained therein, the steps comprising (1) disposing a mixture of a methyl-phenyl-silicone varnish and a volatile vehicle upon a component of said electrical device, said component being one other than said body of semiconductor material, (2) heating said component to a temperature of 375° C. ± 20° C. for 15 minutes, (3) reducing the temperature to 275° C., (4) heating said component at the reduced temperature of 275° C. for 10 minutes, (5) cooling said component to 100° C. ± 10° C. before removing said component to original ambient, (6) enclosing said component and said body within an enclosed portion of said electrical device, (7) heating said enclosed portion at a temperature of from 450° C. to 500° C. for 10 to 12 minutes to vaporize said methyl-phenyl-silicone varnish and (8) cooling said enclosed portion whereby said methyl-phenyl-silicone varnish is deposited on at least that portion of a surface of said body in which portion of a P-N junction is situated.

7. The process of claim 6 including (8) hermetically sealing said enclosed portion, said hermetical sealing being performed during the process steps of vaporizing and cooling said methyl-phenyl-silicone varnish whereby said varnish is deposited on at least that portion of a surface of said body in which portion of a P-N junction is situated.

8. A process for coating at least those portions of a surface of a body of semiconductor material in an electrical device in which a portion of a P-N junction is contained therein, the steps comprising (1) disposing an amount of an elastomeric silicone resin in an enclosed portion of said electrical device, said enclosed portion containing said body of semiconductor material, (2) heating said enclosed portion at a sufficient temperature for a sufficient time to vaporize said elastomeric silicone resin and (3) cooling said enclosed portion whereby said elastomeric silicone resin is deposited on at least that portion of a surface of said body in which said portion of a P-N junction is situated.

References Cited

UNITED STATES PATENTS

| | | | |
|---|---|---|---|
| 2,937,110 | 5/1960 | John | 117—200 |
| 2,913,358 | 11/1959 | Harrington et al. | 117—200 |

ALFRED L. LEAVITT, *Primary Examiner.*

A. M. GRIMALDI, *Assistant Examiner.*